(12) United States Patent
Moon et al.

(10) Patent No.: US 8,471,439 B2
(45) Date of Patent: Jun. 25, 2013

(54) ACTIVE PIEZOELECTRIC ENERGY HARVESTER WITH EMBEDDED VARIABLE CAPACITANCE LAYER AND METHOD OF MANUFACTURING THE SAME

(75) Inventors: Seung Eon Moon, Daejeon (KR); Sung Q Lee, Daejeon (KR); Sang Kyun Lee, Gwangju (KR); Yil Suk Yang, Daejeon (KR); Kang Ho Park, Daejeon (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 367 days.

(21) Appl. No.: 12/899,499

(22) Filed: Oct. 6, 2010

(65) Prior Publication Data
US 2011/0140579 A1 Jun. 16, 2011

(30) Foreign Application Priority Data
Dec. 14, 2009 (KR) .................. 10-2009-0123946

(51) Int. Cl.
*H02N 2/18* (2006.01)
(52) U.S. Cl.
CPC .................................. *H02N 2/186* (2013.01)
USPC ............ 310/339; 310/330; 310/331; 310/332
(58) Field of Classification Search
USPC .......................................... 310/330–332, 339
See application file for complete search history.

(56) References Cited

U.S. PATENT DOCUMENTS

| | | | |
|---|---|---|---|
| 6,943,484 B2 | 9/2005 | Clark et al. | |
| 7,098,577 B2 * | 8/2006 | Mehta | 310/332 |
| 7,623,007 B2 * | 11/2009 | Nakatsuka et al. | 333/133 |
| 7,732,990 B2 * | 6/2010 | Nishigaki et al. | 310/331 |
| 7,893,599 B2 * | 2/2011 | Morris et al. | 310/339 |
| 7,898,157 B2 * | 3/2011 | Churchill et al. | 310/339 |
| 8,022,599 B2 * | 9/2011 | Kawakubo et al. | 310/330 |
| 8,330,334 B2 * | 12/2012 | Lee et al. | 310/339 |
| 8,358,049 B2 * | 1/2013 | Morris et al. | 310/329 |
| 2006/0175937 A1 * | 8/2006 | Clingman et al. | 310/339 |
| 2011/0304240 A1 * | 12/2011 | Meitav et al. | 310/319 |
| 2013/0038175 A1 | 2/2013 | Ogawa et al. | |

FOREIGN PATENT DOCUMENTS

| | | |
|---|---|---|
| JP | 11-346138 A | 12/1999 |
| JP | 2005-192388 A | 7/2005 |
| JP | 2010-051945 A | 3/2010 |
| KR | 10-1998-0006829 A | 3/1998 |
| KR | 2005-0108054 A | 11/2005 |
| KR | 2009-0032598 A | 4/2009 |
| KR | 10-2013-0003017 A | 1/2013 |

OTHER PUBLICATIONS

Wen-Pin Shih et al. "Tunable Capacitor Based on Polymer-Dispersed Liquid Crystal for Power Harvesting Microsystems", IEEE Transactions Electron Devices, vol. 55, No. 10, Oct. 2008.

* cited by examiner

*Primary Examiner* — J. San Martin
(74) *Attorney, Agent, or Firm* — Rabin & Berdo, P.C.

(57) ABSTRACT

Provided is an active piezoelectric energy harvester, which can control a direct current voltage applied to an embedded variable capacitance layer to precisely adjust a resonance frequency in real time, and thus achieve a simpler structure and a smaller size compared to a conventional one that adjusts the resonance frequency using a separate variable capacitor provided outside. Further, the active piezoelectric energy harvester can precisely adjust the resonance frequency even when the frequency of vibration varies over time as in a real natural vibration environment or when it is degraded to undergo a variation in its own resonance frequency, and thus can continuously maintain optimal energy conversion characteristics.

11 Claims, 5 Drawing Sheets

«ACTIVE PIEZOELECTRIC ENERGY HARVESTER WITH EMBEDDED VARIABLE CAPACITANCE LAYER AND METHOD OF MANUFACTURING THE SAME

CROSS-REFERENCE TO RELATED APPLICATION

This application claims priority to and the benefit of Korean Patent Application No. 10-2009-0123946, filed Dec. 14, 2009, the disclosure of which is incorporated herein by reference in its entirety.

BACKGROUND

1. Field of the Invention

The present invention relates generally to an active piezoelectric energy harvester with an embedded variable capacitance layer and a method of manufacturing the same and, more particularly, to an active piezoelectric energy harvester with an embedded variable capacitance layer and a method of manufacturing the same, in which a direct current voltage applied to the embedded variable capacitance layer is controlled to precisely adjust a resonance frequency in real time.

2. Discussion of Related Art

Piezoelectric energy harvesters are elements that cause bending, contraction, extension, etc. in a piezoelectric layer using vibration or pressure and thus generate an alternating current voltage by a piezoelectric effect.

These piezoelectric energy harvesters are variously applied in that they can use pressure or vibration caused by exercise of a person, pressure or vibration caused by a vehicle such as a car, and pressure or vibration caused by a natural environment.

FIG. 1 illustrates a conventional cantilever type piezoelectric energy harvester.

Referring to FIG. 1, a conventional cantilever type piezoelectric energy harvester 100 is configured such that, when one free end thereof is displaced by external vibration, a stress is applied to a piezoelectric layer 110 above a fixing layer 130, and thereby changes the position of an internal dipole, and thus an alternating current voltage is induced to piezoelectric layer electrodes 120a and 120b.

Here, the alternating current voltage induced to the piezoelectric layer electrodes 120a and 120b has a polarity determined by whether the stress applied to the piezoelectric layer 110 is a tensile or compressive stress.

This induced alternating current voltage is converted into a direct current voltage by a rectifier circuit 140, undergoes adjustment in its intensity through a control circuit 150, and is stored in a storage device, such as battery and capacitor 160.

However, since the magnitude of the external vibration applied to the piezoelectric energy harvester may vary frequently, a means capable of controlling the resonance frequency of the piezoelectric energy harvester according to the frequency of the external vibration is required.

To this end, a method of varying the mass of a balance weight 170, which is attached to the free end, the cantilever tip, of the piezoelectric energy harvester, or the length of the cantilever itself to control the resonance frequency is used.

However, this method has a problem in that it is difficult to precisely control the resonance frequency, as well as that it is impossible to control the resonance frequency in real time during energy conversion.

To solve this problem, a method of connecting a variable capacitor to the outside of the piezoelectric energy harvester to control the resonance frequency has been suggested.

In the case of this method, since the variable capacitor is separately provided, the size of the entire element is increased.

SUMMARY OF THE INVENTION

The present invention is directed to an active piezoelectric energy harvester capable of precisely adjusting a resonance frequency in real time with a simple structure.

The other objects of the present invention will be apparent from the following description and embodiments of the present invention.

One aspect of the present invention provides an active piezoelectric energy harvester, including: a piezoelectric layer generating a voltage by vibration or pressure; a fixing layer fixing the piezoelectric layer; and a variable capacitance layer fixed to one region of the fixing layer away from the piezoelectric layer and having a capacitance which varies depending on an applied voltage. Here, the variation in the capacitance of the variable capacitance layer causes a variation in resonance frequency.

In exemplary embodiments, the piezoelectric layer may be formed of one selected from aluminum nitride (AlN), zinc oxide (ZnO), lead-zirconium-titanium composite oxide (PZT $(Pb(Zr,Ti)O_3)$), barium-strontium-titanium composite oxide $(BST((Ba,Sr)TiO_3))$, sodium-potassium-niobium composite oxide $(NKN((Na,K)NbO_3))$, carbon nanotube (CNT), polyvinylidene fluoride (PVDF), and polypropylene-polyethylene (PP-PE).

In exemplary embodiments, the fixing layer may be formed of one selected from a printed circuit board (PCB), silicon, polycarbonate, quartz, gallium arsenide (GaAs), indium phosphide (InP), and glass.

In exemplary embodiments, the variable capacitance layer may be formed of one selected from aluminum nitride (AlN), zinc oxide (ZnO), lead-zirconium-titanium composite oxide $(PZT(Pb(Zr,Ti)O_3))$, barium-strontium-titanium composite oxide $(BST((Ba,Sr)TiO_3))$, sodium-potassium-niobium composite oxide $(NKN((Na,K)NbO_3))$, carbon nanotube (CNT), polyvinylidene fluoride (PVDF), and polypropylene-polyethylene (PP-PE).

In exemplary embodiments, the active piezoelectric energy harvester may further include: piezoelectric layer electrodes formed on and under the piezoelectric layer; fixing layer electrodes formed on and under the fixing layer; and variable capacitance layer electrodes formed on and under the variable capacitance layer. Here, the piezoelectric layer electrodes, the fixing layer electrodes, and the variable capacitance layer electrodes may be formed of one selected from silver, gold, platinum, copper, aluminum, rhodium, iridium, ruthenium, palladium, and a conductive oxide.

In exemplary embodiments, when fixed to one region of an upper portion of the fixing layer away from the piezoelectric layer, the variable capacitance layer may be used as a balance weight. When the variable capacitance layer is fixed to a lower portion of the fixing layer, a balance weight may be fixed to one region of an upper portion of the fixing layer.

Another aspect of the present invention provides a method of manufacturing an active piezoelectric energy harvester. The method includes: forming piezoelectric layer electrodes on and under a piezoelectric layer, and forming fixing layer electrodes on and under a fixing layer; fixing the piezoelectric layer having the piezoelectric layer electrodes to an upper portion of the fixing layer having the fixing layer electrodes; forming variable capacitance layer electrodes on and under a variable capacitance layer having a capacitance which varies depending on an applied voltage; and fixing the variable capacitance layer having the variable capacitance layer electrodes to one region of the fixing layer away from the piezoelectric layer.

In exemplary embodiments, fixing the variable capacitance layer having the variable capacitance layer electrodes may further include fixing the variable capacitance layer having the variable capacitance layer electrodes to one region of an upper portion of the fixing layer away from the piezoelectric layer in order to use the variable capacitance layer having the variable capacitance layer electrodes as a balance weight, or fixing a balance weight to one region of an upper portion of the fixing layer away from the piezoelectric layer when the variable capacitance layer having the variable capacitance layer electrodes is fixed to a lower portion of the fixing layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

Figure 1:
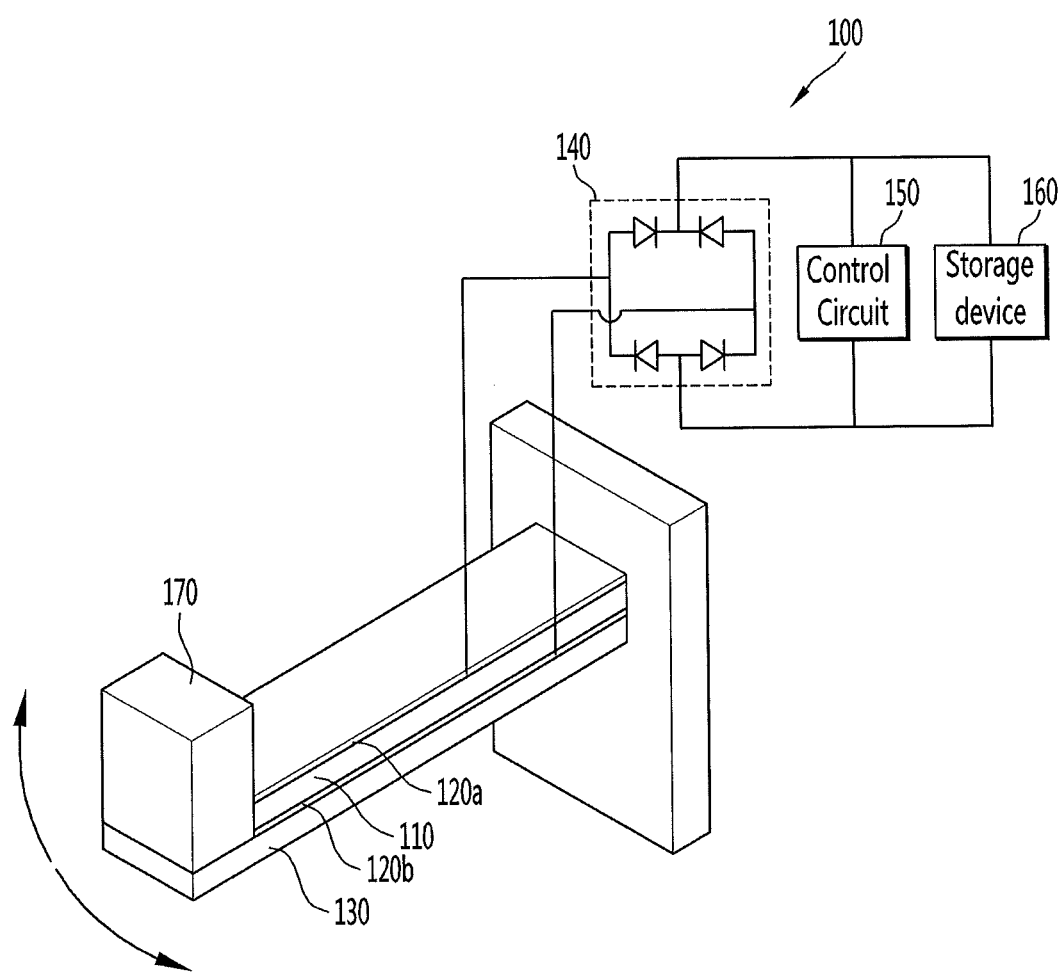
FIG. 1 illustrates a conventional cantilever type piezoelectric energy harvester.

The present invention will be described more fully hereinafter with reference to the accompanying drawings, in which exemplary embodiments of the invention are shown. This invention may, however, be embodied in different forms and should not be construed as limited to the exemplary embodiments set forth herein. In order to keep the following description of the present invention clear and concise, detailed descriptions of known functions and components may be omitted. Technical terms, as will be mentioned hereinafter, are terms defined in light of their function in the present invention, which may vary according to the intention or practice of a user or operator, so that the terms should be defined based on the contents of this specification. When any element of the invention appears in more than one drawing, it is denoted by the same reference numeral in each drawing.

Figure 2:
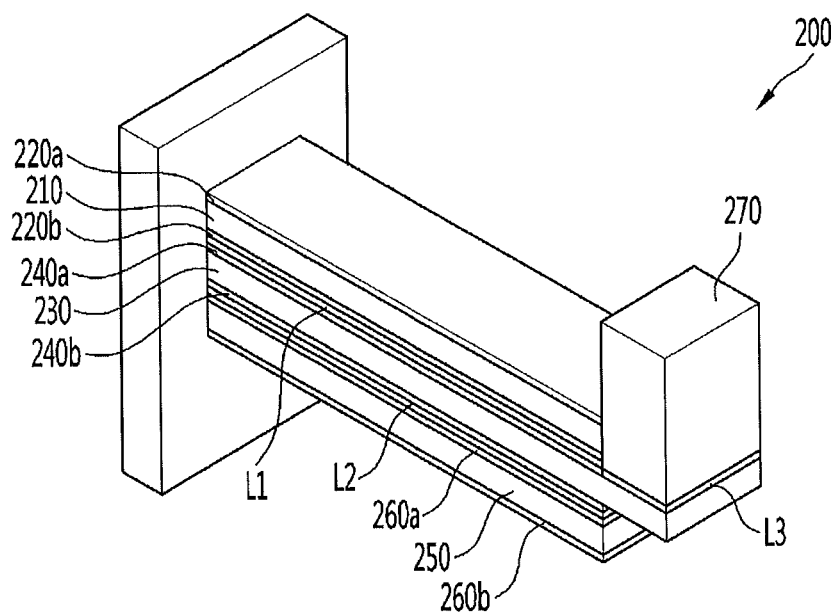
FIG. 2 illustrates an active piezoelectric energy harvester according to an exemplary embodiment of the present invention.

FIG. 2 illustrates an active piezoelectric energy harvester according to an exemplary embodiment of the present invention.

Referring to FIG. 2, an active piezoelectric energy harvester 200 according to an exemplary embodiment of the present invention has the shape of a cantilever, and includes a piezoelectric layer 210 generating a voltage by vibration or pressure, piezoelectric layer electrodes 220a and 220b formed on and under the piezoelectric layer 210, a fixing layer 230 fixing the piezoelectric layer 210, fixing layer electrodes 240a and 240b formed on and under the fixing layer 230, a variable capacitance layer 250 formed on one region (i.e. a lower portion) of the fixing layer 230 away from the piezoelectric layer 210, variable capacitance layer electrodes 260a and 260b formed on and under the variable capacitance layer 250, and a balance weight 270.

Adhesive layers L1, L2 and L3 are formed for adhesion between the piezoelectric layer electrode 220b and the fixing layer electrode 240a, between the fixing layer electrode 240b and the variable capacitance layer electrode 260a, and between the balance weight 270 and the fixing layer 230, respectively.

The piezoelectric layer 210 is formed of a material that generates a voltage by a piezoelectric effect when force, pressure or vibration is applied.

The piezoelectric layer 210 may be formed of quartz, rochelle salt, tourmaline ($(Na,Ca)(Mg,Fe)_3B_3Al_6Si_6(O,OH,F)_{31}$), gallium orthophosphate ($GaPO_4$), CGG group ($Ca_3Ga_2Ge_4O_{14}$), lithium niobate/tantalite ($LiNbO_3$, $LiTaO_3$), lithium tetraborate ($Li_2B_4O_7$), lithium sulfate-monohydrate ($Li_2SO_4H_2O$), bismuth germanium oxide ($Bi_{12}GeO_{20}$), bismuth silicon oxide ($Bi_{12}SiO_{20}$), antimony sulfur iodide (SbSI), aluminum nitride (AlN), zinc oxide (ZnO), lead-zirconium-titanium composite oxide ($PZT(Pb(Zr,Ti)O_3)$), tungsten bronze, perovskite layered structure, barium-strontium-titanium composite oxide ($BST((Ba,Sr)TiO_3)$), sodium-potassium-niobium composite oxide ($NKN((Na,K)NbO_3)$), bismuth titanate, carbon nanotube (CNT), polyvinylidene fluoride (PVDF), or polypropylene-polyethylene (PP-PE).

Further, the piezoelectric layer 210 may be formed of a thin or thick layer ranging from several tens of nanometers to several hundreds of microns by a sputtering deposition method, a thermal deposition method, a laser deposition method, a sol-gel method, an atomic layer deposition method, a spray deposition method, a screen printing method, or the like. Also, the piezoelectric layer 210 may be formed of either a layered ceramic, which is made on the basis of polycrystalline ceramic of several hundreds of microns to several millimeters made by calcinating powder or a green tape made by calcinating powder, or single crystal made by a crystallization process.

The piezoelectric layer electrodes 220a and 220b, the fixing layer electrodes 240a and 240b, and the variable capacitance layer electrodes 260a and 260b are formed of one of silver, gold, platinum, copper, aluminum, rhodium, iridium, ruthenium, palladium, and a conductive oxide. These electrodes may be formed to a thickness of several tens to hundreds of nanometers using a screen printing method, a sputtering deposition method, an electron beam deposition method, a thermal deposition method, a chemical vapor deposition method, or an atomic layer deposition method.

The fixing layer 230 is formed of a printed circuit board (PCB), silicon, polycarbonate, quartz, gallium arsenide (GaAs), indium phosphide (InP) or glass.

The variable capacitance layer 250 is formed of a material in which capacitance varies when a voltage is applied, such as aluminum nitride (AlN), zinc oxide (ZnO), lead-zirconium-titanium composite oxide ($PZT(Pb(Zr,Ti)O_3)$), barium-strontium-titanium composite oxide ($BST((Ba,Sr)TiO_3)$), sodium-potassium-niobium composite oxide ($NKN((Na,K)NbO_3)$), carbon nanotube (CNT), polyvinylidene fluoride (PVDF), or polypropylene-polyethylene (PP-PE).

The balance weight 270 is typically formed on the upper portion of the fixing layer 230 using a high-density metal such as tungsten.

The greatest feature of the active piezoelectric energy harvester 200 having this structure is that it can control the direct current voltage applied to the variable capacitance layer 250 to vary a natural frequency of the cantilever.

In the active piezoelectric energy harvester 200 according to the present invention, a load or force F, which is applied to the free end of the cantilever and thus causes displacement y, may be expressed by the following Equation 1.

$$F = k_{eff} y \qquad \text{Equation 1}$$

where F is the load or force applied to the free end of the cantilever, $k_{eff}$ is the effective rigidity of spring, and y is the displacement caused by the load or force applied to the free end of the cantilever.

The displacement y of the cantilever in Equation 1 may be expressed by the following Equation 2.

$$y = \frac{F}{6EI}(-x^3 + 3L^2 x - 2L^3) \qquad \text{Equation 2}$$

where F is the load or force applied to the free end of the cantilever, E is the young's modulus, I is the moment of inertia, x is the distance from the free end of the cantilever, and L is the length of the cantilever.

Thus, the displacement y at the free end of the cantilever, (i.e. when x=0) may be expressed by the following Equation 3.

$$y = \frac{FL^3}{3EI} \qquad \text{Equation 3}$$

Meanwhile, the effective rigidity $k_{eff}$ of spring in Equation 1 may be expressed by the following Equation 4.

$$k_{eff} = \frac{3EI}{L^3} \qquad \text{Equation 4}$$

where E is the young's modulus, I is the moment of inertia, and L is the length of the cantilever.

The young's modulus E in Equation 4 may be expressed by the following Equation 5.

$$E = \left(s - \frac{d^2}{\varepsilon}\zeta Z\right)^{-1} \qquad \text{Equation 5}$$

where s is the mechanical elasticity of the variable capacitance layer 250, $\varepsilon$ is the permittivity of the variable capacitance layer 250, d is the electromechanical coupling coefficient, $\zeta$ is the Laplace variable, and Z is the impedance of the variable capacitance layer 250.

The impedance Z of the variable capacitance layer 250 in Equation 5 may be expressed by the following Equation 6.

$$Z = (C\zeta)^{-1} \qquad \text{Equation 6}$$

where C is the capacitance of the variable capacitance layer 250, and $\zeta$ is the Laplace variable.

The capacitance C of the variable capacitance layer 250 in Equation 6 may be expressed by the following Equation 7.

$$C = \frac{\varepsilon A}{t} \qquad \text{Equation 7}$$

where $\varepsilon$ is the permittivity of the variable capacitance layer 250, A is the electrode area of the variable capacitance layer 250, and t is the thickness of the variable capacitance layer 250.

When a direct current voltage is applied to the variable capacitance layer 250, the permittivity $\varepsilon$ varies due to reorientation of dipole moments. Thus, the capacitance C of the variable capacitance layer 250 varies according to Equation 7, and the impedance Z of the variable capacitance layer 250 varies according to Equation 6.

When the impedance Z of the variable capacitance layer 250 varies, the young's modulus E varies according to Equation 5. When the young's modulus E varies, the effective rigidity $k_{eff}$ of spring varies according to Equation 4.

Generally, the natural frequency w of the cantilever may be expressed by the following Equation 8.

$$w = \sqrt{\frac{k_{eff}}{m_{eff}}} \qquad \text{Equation 8}$$

where $k_{eff}$ is the effective rigidity of spring, and $k_{eff}$ is the effective mass.

With regard to Equation 8, the effective rigidity $k_{eff}$ of spring must vary in order to vary the natural frequency w of the cantilever, and the young's modulus E must vary in order to vary the effective rigidity $k_{eff}$ of spring.

From this standpoint, when the capacitance C of the variable capacitance layer 250 varies by controlling the direct current voltage applied to the variable capacitance layer 250, the variation of the capacitance C, the variation of the impedance Z, the variation of the young's modulus E, and the variation of the effective spring rigidity $k_{eff}$, are sequentially induced as described above, so that the natural frequency w of the cantilever can vary.

Figure 3:
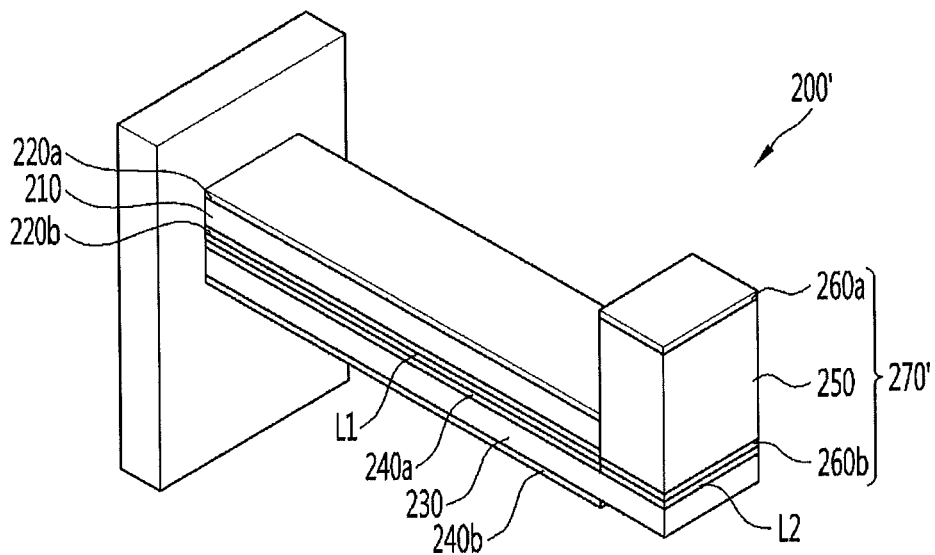
FIG. 3 illustrates an active piezoelectric energy harvester according to another exemplary embodiment of the present invention.

FIG. 3 illustrates an active piezoelectric energy harvester according to another exemplary embodiment of the present invention.

Referring to FIG. 3, an active piezoelectric energy harvester 200' according to another exemplary embodiment of the present invention is different from the active piezoelectric energy harvester 200 illustrated in FIG. 2 in that it uses a variable capacitance layer 250 as a balance weight without a separate balance weight.

In other words, the variable capacitance layer 250 is formed on one region of the upper portion of a fixing layer 230 away from the piezoelectric layer 210, thereby using the variable capacitance layer 250 as the balance weight.

In the case where the variable capacitance layer 250 is used as the balance weight in this way, it is possible to further increase a variation in entire capacitance, compared to the active piezoelectric energy harvester 200 illustrated in FIG. 2.

Figure 4:
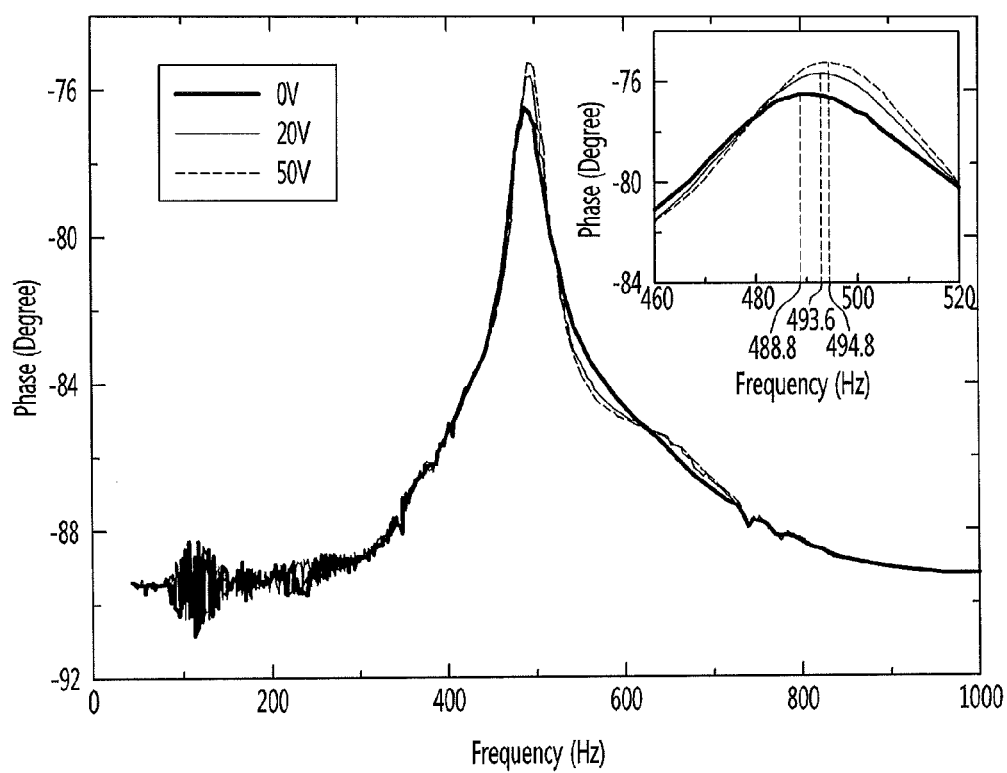
FIG. 4 is a graph showing a phase angle measured based on a frequency of the active piezoelectric energy harvester illustrated in FIG. 4.

FIG. 4 is a graph showing a phase angle measured based on a frequency of the active piezoelectric energy harvester according to an exemplary embodiment of the present invention.

The active piezoelectric energy harvester used for measuring the phase angle is manufactured as follow. A piezoelectric layer is formed of lead magnesium niobate-lead zirconate titanate (PMN-PZT) piezoelectric single crystal above a fixing layer formed of a PCB, while a variable capacitance layer is formed of PMN-PZT piezoelectric single crystal below the fixing layer. A balance weight is fixed to a free end of a cantilever. Here, each of the piezoelectric layer, the fixing layer, and the variable capacitance layer has electrodes formed of gold thereon and thereunder.

When a direct current voltage is applied to the variable capacitance layer formed of PMN-PZT piezoelectric single crystal, the capacitance C of the variable capacitance layer is reduced as described above, so that a resonance frequency w of the piezoelectric energy harvester increases.

For real measurement, direct current voltages of 0 V, 20 V and 50 V were applied to the variable capacitance layer, and then a phase angle was measured according to the frequency using an impedance analyzer. As shown in FIG. 4, it could be seen that the resonance frequency gradually increased to 488.8 Hz, 493.6 Hz, and 494.8 Hz.

As mentioned above, the active piezoelectric energy harvester according to the present invention controls the direct current voltage applied to the variable capacitance layer 250, so that it can precisely vary the natural frequency of the cantilever in real time.

Thus, the active piezoelectric energy harvester according to the present invention can have a simpler structure and a smaller size, compared to a conventional one that controls the resonance frequency using a separate variable capacitor.

Further, the active piezoelectric energy harvester according to the present invention can precisely adjust the resonance frequency even when the frequency of vibration varies over time as in a real natural vibration environment or when it is degraded to undergo a variation in its own resonance frequency, and thus can continuously maintain optimal energy conversion characteristics.

Hereinafter, a method of manufacturing the active piezoelectric energy harvester according to the present invention will be described.

FIGS. 5A through 5F are views for explaining a method of manufacturing an active piezoelectric energy harvester according to the present invention.

Figure 5A:
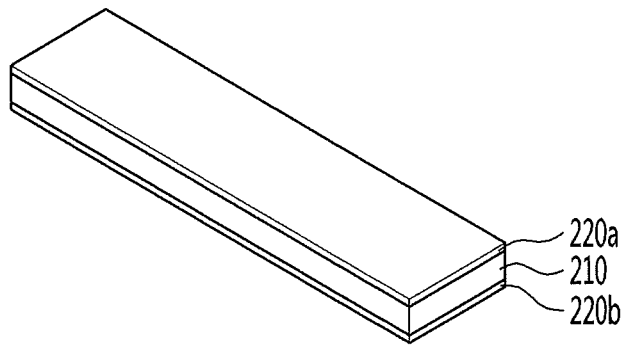
FIGS. 5A through 5F are views for explaining a method of manufacturing an active piezoelectric energy harvester according to the present invention.

First, as illustrated in FIG. 5A, piezoelectric layer electrodes 220a and 220b are formed on and under a piezoelectric layer 210.

Figure 5B:
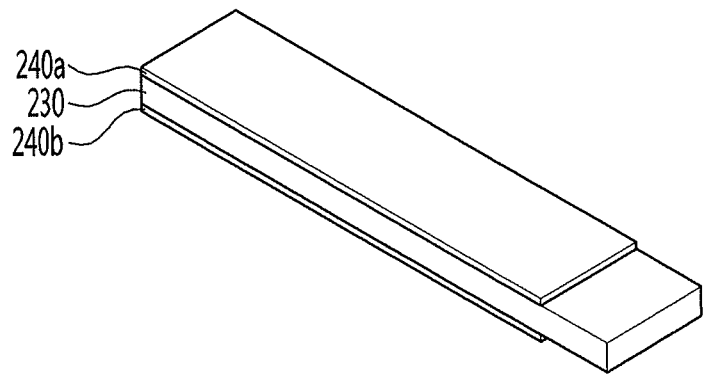

Next, as illustrated in FIG. 5B, fixing layer electrodes 240a and 240b are formed on and under a fixing layer 230.

Here, a sequence of forming the piezoelectric layer electrodes 220a and 220b and the fixing layer electrodes 240a and 240b may be inverted. According to circumstances, the piezoelectric layer electrodes 220a and 220b and the fixing layer electrodes 240a and 240b may be simultaneously formed.

Figure 5C:
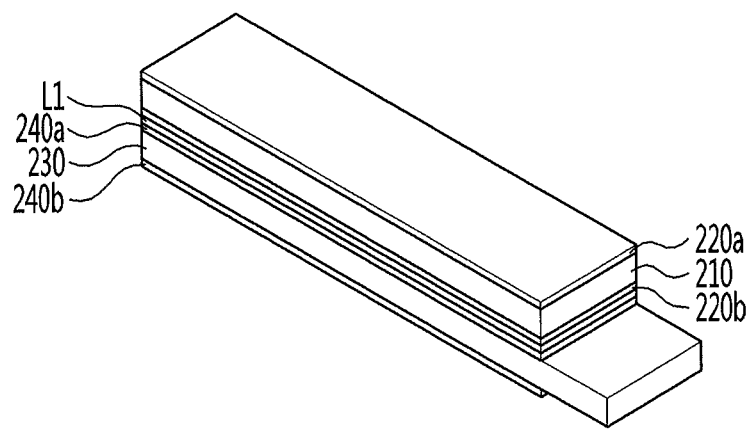

Subsequently, as illustrated in FIG. 5C, the piezoelectric layer 210 having the piezoelectric layer electrodes 220a and 220b is fixed to an upper portion of the fixing layer 230 having the fixing layer electrodes 240a and 240b using an adhesive layer L1.

Here, the piezoelectric layer electrodes 220a and 220b may be polarized, and then fixed to the upper portion of the fixing layer 230.

Figure 5D:
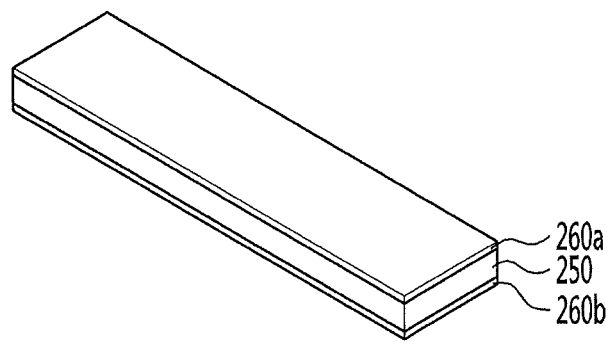

Next, as illustrated in FIG. 5D, variable capacitance layer electrodes 260a and 260b are formed on and under a variable capacitance layer 250.

Here, the variable capacitance layer electrodes 260a and 260b may be formed in the process of forming the piezoelectric layer electrodes 220a and 220b and the fixing layer electrodes 240a and 240b.

Figure 5E:
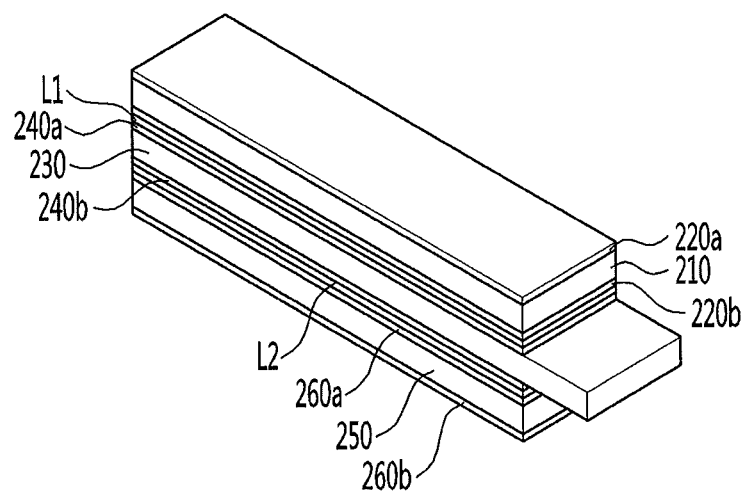

Then, as illustrated in FIG. 5E, the variable capacitance layer 250 having the variable capacitance layer electrodes 260a and 260b is fixed to one region (i.e. a lower portion) of the fixing layer 230 away from the piezoelectric layer 210 using an adhesive layer L2.

Here, to use the variable capacitance layer 250 having the variable capacitance layer electrodes 260a and 260b as a balance weight, the variable capacitance layer 250 having the variable capacitance layer electrodes 260a and 260b may be fixed to one region of the upper portion of the fixing layer 230 (see FIG. 3).

Figure 5F:
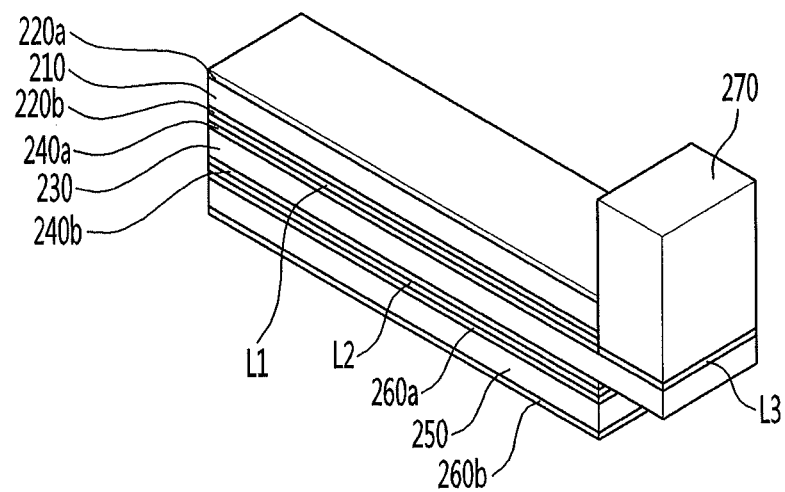

Finally, as illustrated in FIG. 5F, a balance weight 270 is fixed to one region of the upper portion of the fixing layer 230 using an adhesive layer L3. Thereby, the piezoelectric energy harvester according to the present invention is completed.

According to exemplary embodiments of the present invention, an active piezoelectric energy harvester can control a direct current voltage applied to an embedded variable capacitance layer to precisely adjust a resonance frequency in real time, and thus achieve a simpler structure and a smaller size compared to a conventional one that adjusts the resonance frequency using a separate variable capacitor provided outside.

Further, the active piezoelectric energy harvester can precisely adjust the resonance frequency even when the frequency of vibration varies over time as in a real natural vibration environment or when it is degraded to undergo a variation in its own resonance frequency, and thus can continuously maintain optimal energy conversion characteristics.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An active piezoelectric energy harvester comprising:
a piezoelectric layer generating a voltage by vibration or pressure;
a fixing layer fixing the piezoelectric layer; and
a variable capacitance layer fixed to one region of the fixing layer away from the piezoelectric layer and having a capacitance which varies depending on an applied voltage,
wherein the variation in the capacitance of the variable capacitance layer causes a variation in resonance frequency.

2. The active piezoelectric energy harvester according to claim 1, wherein the piezoelectric layer is formed of one selected from aluminum nitride (AlN), zinc oxide (ZnO), lead-zirconium-titanium composite oxide (PZT(Pb(Zr,Ti)$O_3$)), barium-strontium-titanium composite oxide (BST((Ba,Sr)Ti$O_3$)), sodium-potassium-niobium composite oxide (NKN((Na,K)Nb$O_3$)), carbon nanotube (CNT), polyvinylidene fluoride (PVDF), and polypropylene-polyethylene (PP-PE).

3. The active piezoelectric energy harvester according to claim 1, wherein the fixing layer is formed of one selected from a printed circuit board (PCB), silicon, polycarbonate, quartz, gallium arsenide (GaAs), indium phosphide (InP), and glass.

4. The active piezoelectric energy harvester according to claim 1, wherein the variable capacitance layer is formed of one selected from aluminum nitride (AlN), zinc oxide (ZnO), lead-zirconium-titanium composite oxide (PZT(Pb(Zr,Ti)$O_3$)), barium-strontium-titanium composite oxide (BST((Ba,Sr)Ti$O_3$)), sodium-potassium-niobium composite oxide (NKN((Na,K)Nb$O_3$)), carbon nanotube (CNT), polyvinylidene fluoride (PVDF), and polypropylene-polyethylene (PP-PE).

5. The active piezoelectric energy harvester according to claim 1, further comprising:
piezoelectric layer electrodes formed on and under the piezoelectric layer;

fixing layer electrodes formed on and under the fixing layer; and variable capacitance layer electrodes formed on and under the variable capacitance layer.

6. The active piezoelectric energy harvester according to claim 5, wherein the piezoelectric layer electrodes, the fixing layer electrodes, and the variable capacitance layer electrodes are formed of one selected from silver, gold, platinum, copper, aluminum, rhodium, iridium, ruthenium, palladium, and a conductive oxide.

7. The active piezoelectric energy harvester according to claim 1, wherein, when fixed to one region of an upper portion of the fixing layer away from the piezoelectric layer, the variable capacitance layer is used as a balance weight.

8. The active piezoelectric energy harvester according to claim 1, wherein, when the variable capacitance layer is fixed to a lower portion of the fixing layer, a balance weight is fixed to one region of an upper portion of the fixing layer.

9. A method of manufacturing an active piezoelectric energy harvester, comprising:

forming piezoelectric layer electrodes on and under a piezoelectric layer, and forming fixing layer electrodes on and under a fixing layer;

fixing the piezoelectric layer having the piezoelectric layer electrodes to an upper portion of the fixing layer having the fixing layer electrodes;

forming variable capacitance layer electrodes on and under a variable capacitance layer having a capacitance which varies depending on an applied voltage; and fixing the variable capacitance layer having the variable capacitance layer electrodes to one region of the fixing layer away from the piezoelectric layer.

10. The method according to claim 9, wherein fixing the variable capacitance layer having the variable capacitance layer electrodes further includes fixing the variable capacitance layer having the variable capacitance layer electrodes to one region of an upper portion of the fixing layer away from the piezoelectric layer in order to use the variable capacitance layer having the variable capacitance layer electrodes as a balance weight.

11. The method according to claim 9, wherein fixing the variable capacitance layer having the variable capacitance layer electrodes further includes fixing a balance weight to one region of an upper portion of the fixing layer away from the piezoelectric layer when the variable capacitance layer having the variable capacitance layer electrodes is fixed to a lower portion of the fixing layer.

* * * * *